United States Patent
Nishimoto et al.

(10) Patent No.: US 10,411,002 B2
(45) Date of Patent: Sep. 10, 2019

(54) ELECTRIC POWER CONVERSION CIRCUIT INCLUDING SWITCHES AND BOOTSTRAP CIRCUITS, AND ELECTRIC POWER TRANSMISSION SYSTEM INCLUDING ELECTRIC POWER CONVERSION CIRCUIT

(71) Applicant: Panasonic Intellectual Property Management Co., Ltd., Osaka (JP)

(72) Inventors: Taiki Nishimoto, Osaka (JP); Atsushi Yamamoto, Kyoto (JP); Shoichi Hara, Tokyo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 344 days.

(21) Appl. No.: 15/590,774

(22) Filed: May 9, 2017

(65) Prior Publication Data
US 2017/0345808 A1    Nov. 30, 2017

(30) Foreign Application Priority Data

May 26, 2016    (JP) .................................. 2016-105499

(51) Int. Cl.
*H01L 27/02* (2006.01)
*H01L 27/06* (2006.01)
(Continued)

(52) U.S. Cl.
CPC .............. *H01L 27/02* (2013.01); *H01L 27/06* (2013.01); *H01L 27/088* (2013.01); *H02M 1/08* (2013.01); *H02M 7/538* (2013.01); *H02P 9/105* (2013.01); *H03F 3/24* (2013.01); *H03F 3/45076* (2013.01); *H03M 1/06* (2013.01); *H03F 2203/7239* (2013.01)

(58) Field of Classification Search
CPC ....... H01L 27/02; H01L 27/06; H01L 27/088; H02M 1/08; H02M 7/538; H02P 9/105; H03F 3/24; H03F 3/45076; H03F 2203/7239; H03M 1/06
USPC .......................................................... 361/56
See application file for complete search history.

(56) References Cited

U.S. PATENT DOCUMENTS

2005/0162870 A1    7/2005  Hirst
2009/0085404 A1    4/2009  Suzuki et al.
(Continued)

FOREIGN PATENT DOCUMENTS

JP    2005-210894    8/2005
JP    2006-254694    9/2006
(Continued)

*Primary Examiner* — Kevin J Comber
(74) *Attorney, Agent, or Firm* — McDermott Will & Emery LLP

(57) ABSTRACT

An electric power conversion circuit includes: first and second input terminals; first and second output terminals; first and third switches connected to the first output terminal; second and fourth switches connected to the second output terminal; first through fourth diodes that are bridge-connected between the first and second switches; fifth through eighth diodes that are bridge-connected between the third and fourth switches; a first bootstrap circuit that is connected to control terminals of the second and fourth switches; and a second bootstrap circuit that is connected to control terminals of the first and third switches.

13 Claims, 15 Drawing Sheets

(51) Int. Cl.
  *H01L 27/088* (2006.01)
  *H02P 9/10* (2006.01)
  *H03F 3/24* (2006.01)
  *H03F 3/45* (2006.01)
  *H03M 1/06* (2006.01)
  *H02M 1/08* (2006.01)
  *H02M 7/538* (2007.01)

(56) References Cited

U.S. PATENT DOCUMENTS

2012/0230067 A1* 9/2012 Yamanaka ............ H02M 5/293
  363/37
2012/0250375 A1* 10/2012 Satou .................... H02M 7/538
  363/37
2013/0241290 A1  9/2013 Higuchi et al.

FOREIGN PATENT DOCUMENTS

| JP | 2010-035387 | 2/2010 |
| JP | 2014-128126 | 7/2014 |
| WO | 2012/063573 | 5/2012 |

* cited by examiner

B1

B2

ELECTRIC POWER CONVERSION CIRCUIT INCLUDING SWITCHES AND BOOTSTRAP CIRCUITS, AND ELECTRIC POWER TRANSMISSION SYSTEM INCLUDING ELECTRIC POWER CONVERSION CIRCUIT

BACKGROUND

1. Technical Field

The present disclosure relates to an electric power conversion circuit and an electric power transmission system in which electric power is transmitted from a power source to a load through an electric power line by using the electric power conversion circuit as an electric power transmitting device or an electric power receiving device.

2. Description of the Related Art

In recent years, renewable energy represented by solar power, wind power, biofuel power, and the like is increasingly introduced in addition to conventional electric power such as thermal power, hydropower, and nuclear power provided by electric power companies. Furthermore, in addition to existing large-scale commercial electric power networks, introduction of local small-scale electric power networks that enable local production for local consumption of electric power is spreading throughout the world for the purpose of reducing loss during long-distance electric power transmission.

Most renewable energy sources connected to such local small-scale electric power networks are inferior in power generation capability to and is larger in fluctuation of power generation capability than main power sources of the conventional large-scale commercial electric power networks. Therefore, in order to achieve stable and efficient operation of a small-scale electric power network, a technique that allows electric power interchange by selecting a transmission route through which electric power can be transmitted and received with high use efficiency is needed.

Japanese Unexamined Patent Application Publication No. 2010-035387 and Japanese Unexamined Patent Application Publication No. 2005-210894 disclose conventional electric power conversion circuits.

SUMMARY

In one general aspect, the techniques disclosed here feature an electric power conversion circuit including: a first input terminal; a second input terminal; a first output terminal; a second output terminal; a first diode that includes a first anode and a first cathode, the first cathode being connected to the first input terminal; a second diode that includes a second anode and a second cathode, the second anode being connected to the first input terminal; a third diode that includes a third anode and a third cathode, the third cathode being connected to the second input terminal; a fourth diode that includes a fourth anode and a fourth cathode, the fourth anode being connected to the second input terminal; a fifth diode that includes a fifth anode and a fifth cathode, the fifth anode being connected to the first input terminal; a sixth diode that includes a sixth anode and a sixth cathode, the sixth cathode being connected to the first input terminal; a seventh diode that includes a seventh anode and a seventh cathode, the seventh anode being connected to the second input terminal; an eighth diode that includes an eighth anode and an eighth cathode, the eighth cathode being connected to the second input terminal; a first switch that includes a first control terminal and is connected between the first output terminal and the first anode; a second switch that includes a second control terminal and is connected between the second cathode and the second output terminal; a third switch that includes a third control terminal and is connected between the first output terminal and the fifth cathode; a fourth switch that includes a fourth control terminal and is connected between the sixth anode and the second output terminal; a first bootstrap circuit that includes a first voltage source and is connected to the second and fourth control terminals; and a second bootstrap circuit that includes a second voltage source and is connected to the first and third control terminals.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Underlying Knowledge Forming Basis of the Present Disclosure

First, underlying knowledge forming the basis of the present disclosure is described.

Figure 9:
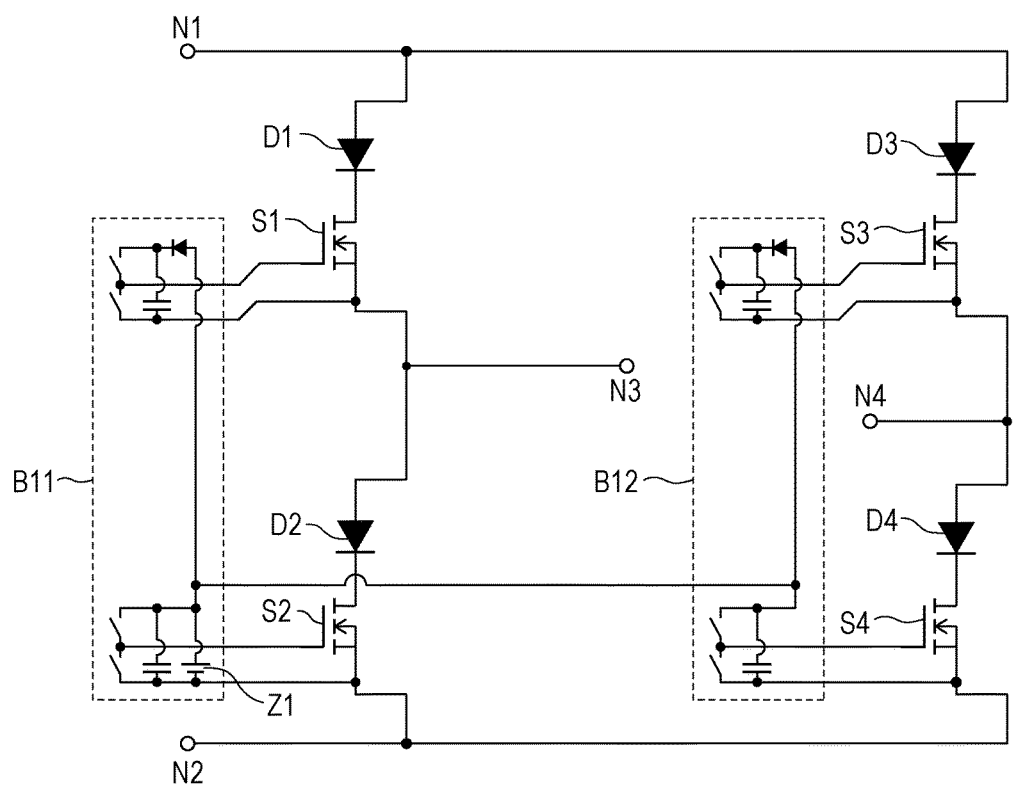
FIG. 9 is a circuit diagram illustrating a configuration of an inverter circuit according to a first comparative example.

FIG. 9 is a circuit diagram illustrating a configuration of an inverter circuit according to a first comparative example that converts direct-current electric power input from port terminals N1 and N2 into alternating-current electric power and then outputs the alternating-current electric power from port terminals N3 and N4. The inverter circuit illustrated in FIG. 9 includes four diodes D1 through D4, four switches S1 through S4, and two bootstrap circuits B11 and B12. The switches S1 through S4 are N-channel MOSFETs. The four switches S1 through S4 are driven by the bootstrap circuits B11 and B12.

Figure 10:
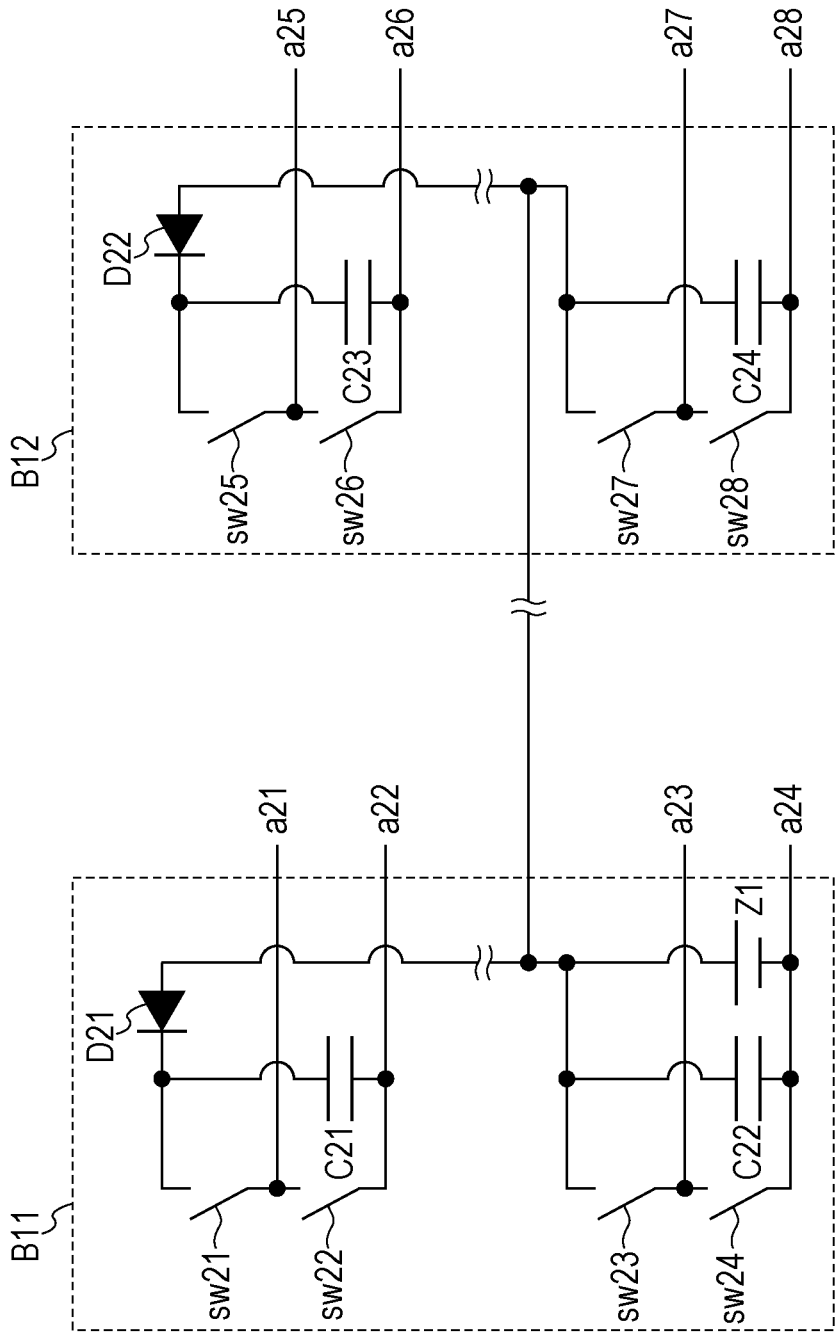
FIG. 10 is a circuit diagram illustrating a configuration of a bootstrap circuit according to the first comparative example.

FIG. 10 is a circuit diagram illustrating a configuration of the bootstrap circuits B11 and B12 illustrated in FIG. 9. The bootstrap circuit B11 includes capacitors C21 and C22, a diode D21, and switches sw21 through sw24. The bootstrap circuit B12 includes capacitors C23 and C24, a diode D22, and switches sw25 through sw28. An isolated power source Z1 is provided in one of the bootstrap circuits B11 and B12, and a voltage of the isolated power source Z1 is applied to the capacitors C21 through C24. Terminals a21 and a22, terminals a23 and a24, terminals a25 and a26, and terminals a27 and a28 constitute four pairs of output terminals of the bootstrap circuits B11 and B12. The terminal a21 is connected to a gate of the switch S1, and the terminal a22 is connected to a source of the switch S1. When the switch sw21 is turned on, a voltage of the capacitor C21 is applied to the gate of the switch S1. When the switch sw22 is turned on, the gate of the switch S1 is reset. Other parts of the bootstrap circuits B11 and B12 are connected to the switches S2 through S4 in a similar manner, and voltages of the capacitors C22 through C24 are applied to gates of the switches S2 through S4.

In the inverter circuit illustrated in FIG. 9, the four switches S1 through S4 are driven by the single isolated power source Z1. Accordingly, the first switch S1 and the second switch S2 are driven by the first bootstrap circuit B11 having two pairs of output terminals. Furthermore, the third switch S3 and the fourth switch S4 are driven by the second bootstrap circuit B12 having two pairs of output terminals.

Figure 11:
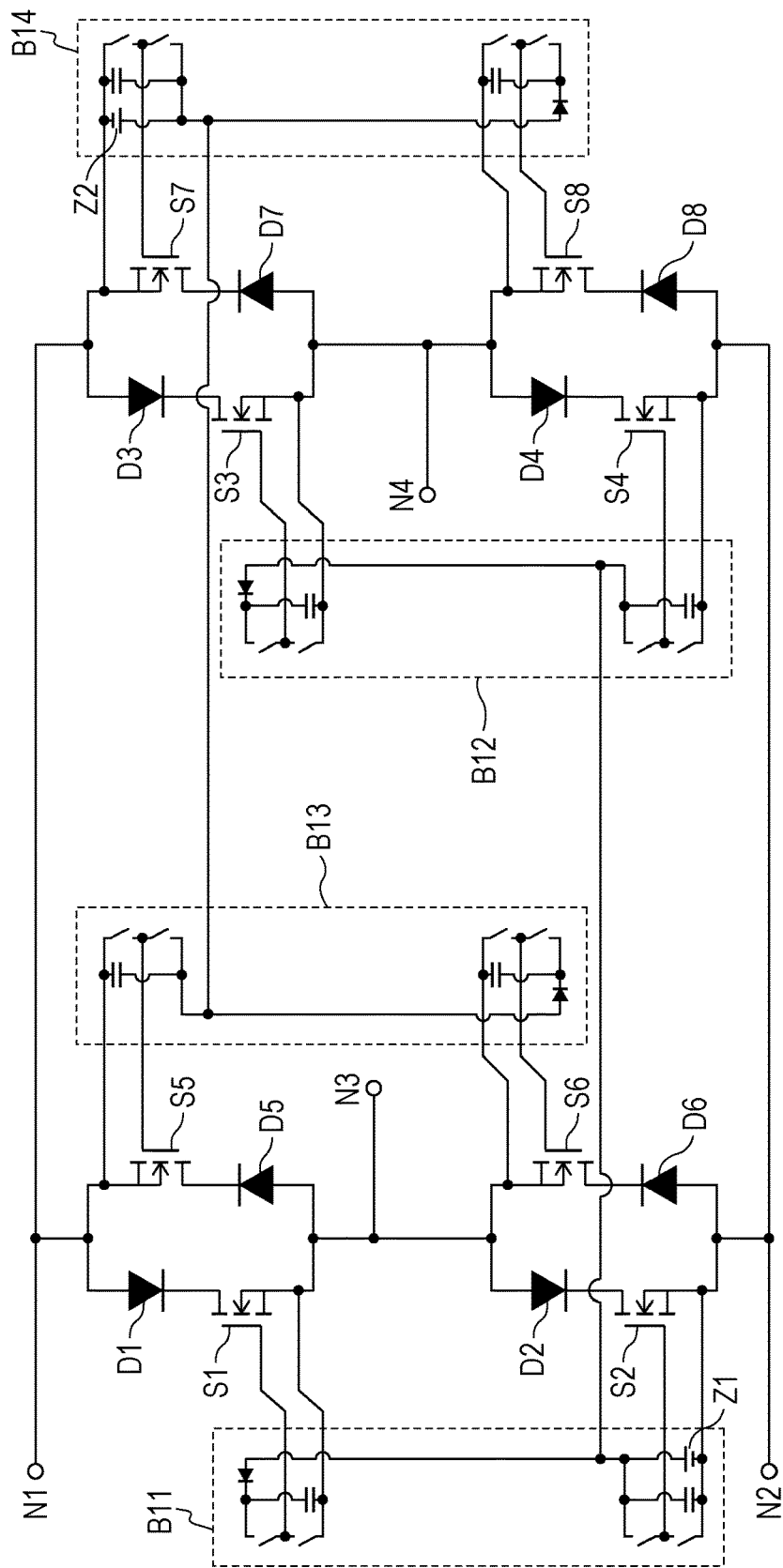
FIG. 11 is a circuit diagram illustrating a configuration of an inverter circuit according to a second comparative example.

FIG. 11 is a circuit diagram illustrating a configuration of an inverter circuit according to a second comparative example that converts and transmits direct-current electric power or alternating-current electric power bi-directionally between port terminals N1 and N2 and port terminals N3 and N4. The inverter circuit illustrated in FIG. 11 includes eight diodes D1 through D8, eight switches S1 through S8, and four bootstrap circuits B11 through B14. The switches S1 through S8 are N-channel MOSFETs. The eight switches S1 through S8 are driven by the bootstrap circuits B11 through B14. The switches S1 and S5 and the diodes D1 and D5 are connected so that electric power is transferred bi-directionally between the port terminals N1 and N3. The switches S2 and S6 and the diodes D2 and D6 are connected so that electric power is transferred bi-directionally between the port terminals N2 and N3. The switches S3 and S7 and the diodes D3 and D7 are connected so that electric power is transferred bi-directionally between the port terminals N1 and N4. The switches S4 and S8 and the diodes D4 and D8 are connected so that electric power is transferred bi-directionally between the port terminals N2 and N4. In this way, the inverter circuit illustrated in FIG. 11 converts and transmits electric power bi-directionally.

The bootstrap circuits B11 and B12 illustrated in FIG. 11 are configured in a manner similar to the bootstrap circuits B11 and B12 illustrated in FIG. 9. The bootstrap circuits B13 and B14 illustrated in FIG. 11 are configured in a manner similar to the bootstrap circuits B11 and B12 illustrated in FIG. 9 and include an isolated power source Z2 instead of the isolated power source Z1.

In the inverter circuit illustrated in FIG. 11, the eight switches S1 through S8 are driven by the two isolated power sources Z1 and Z2. Accordingly, the first switch S1 and the second switch S2 are driven by the first bootstrap circuit B11 having two pairs of output terminals. The third switch S3 and the fourth switch S4 are driven by the second bootstrap circuit B12 having two pairs of output terminals. The fifth switch S5 and the sixth switch S6 are driven by the third bootstrap circuit B13 having two pairs of output terminals. The seventh switch S7 and the eighth switch S8 are driven by the fourth bootstrap circuit B14 having two pairs of output terminals.

Figure 12:
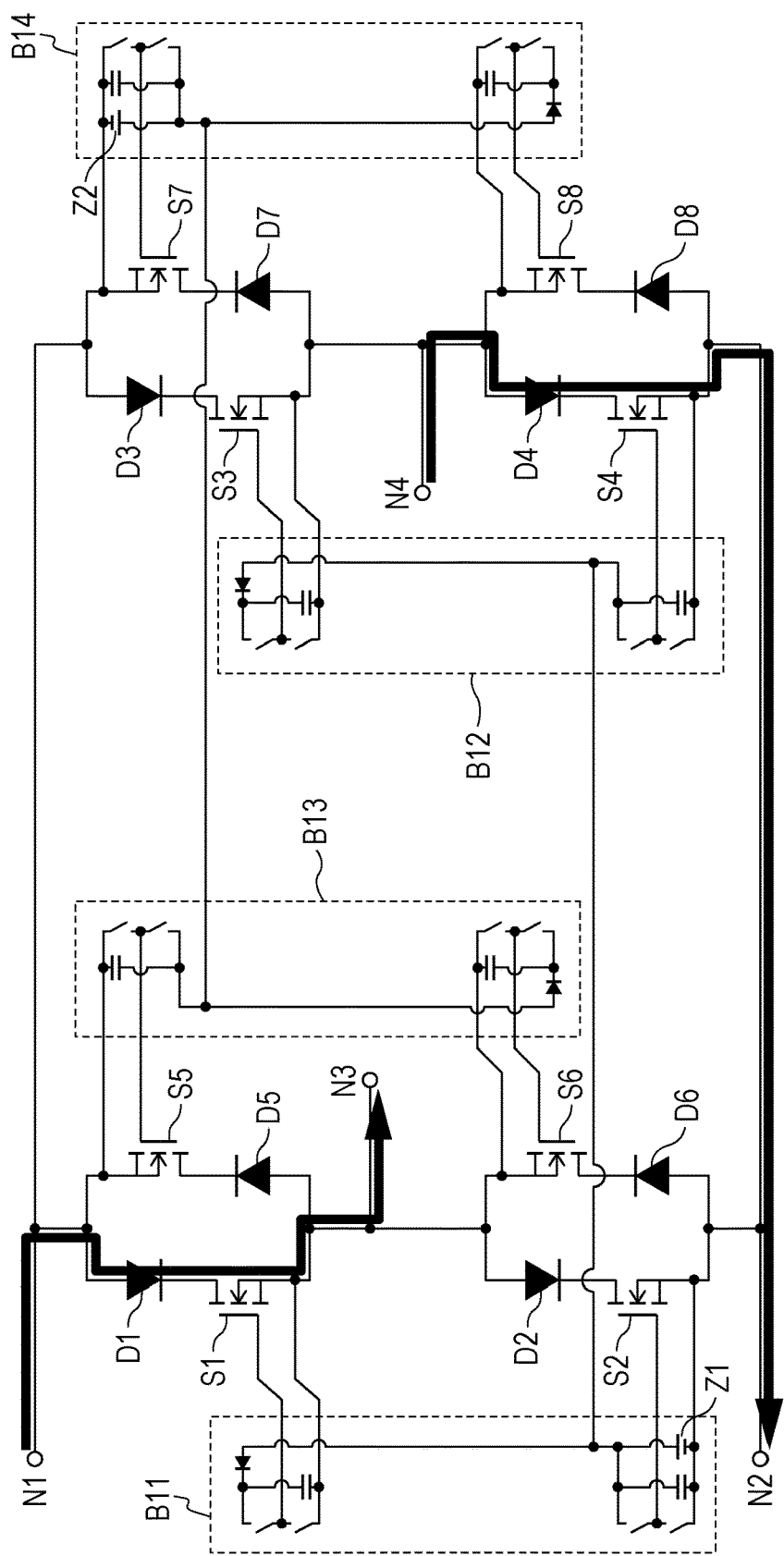
FIG. 12 illustrates ideal operation of the inverter circuit according to the second comparative example.
Figure 13:
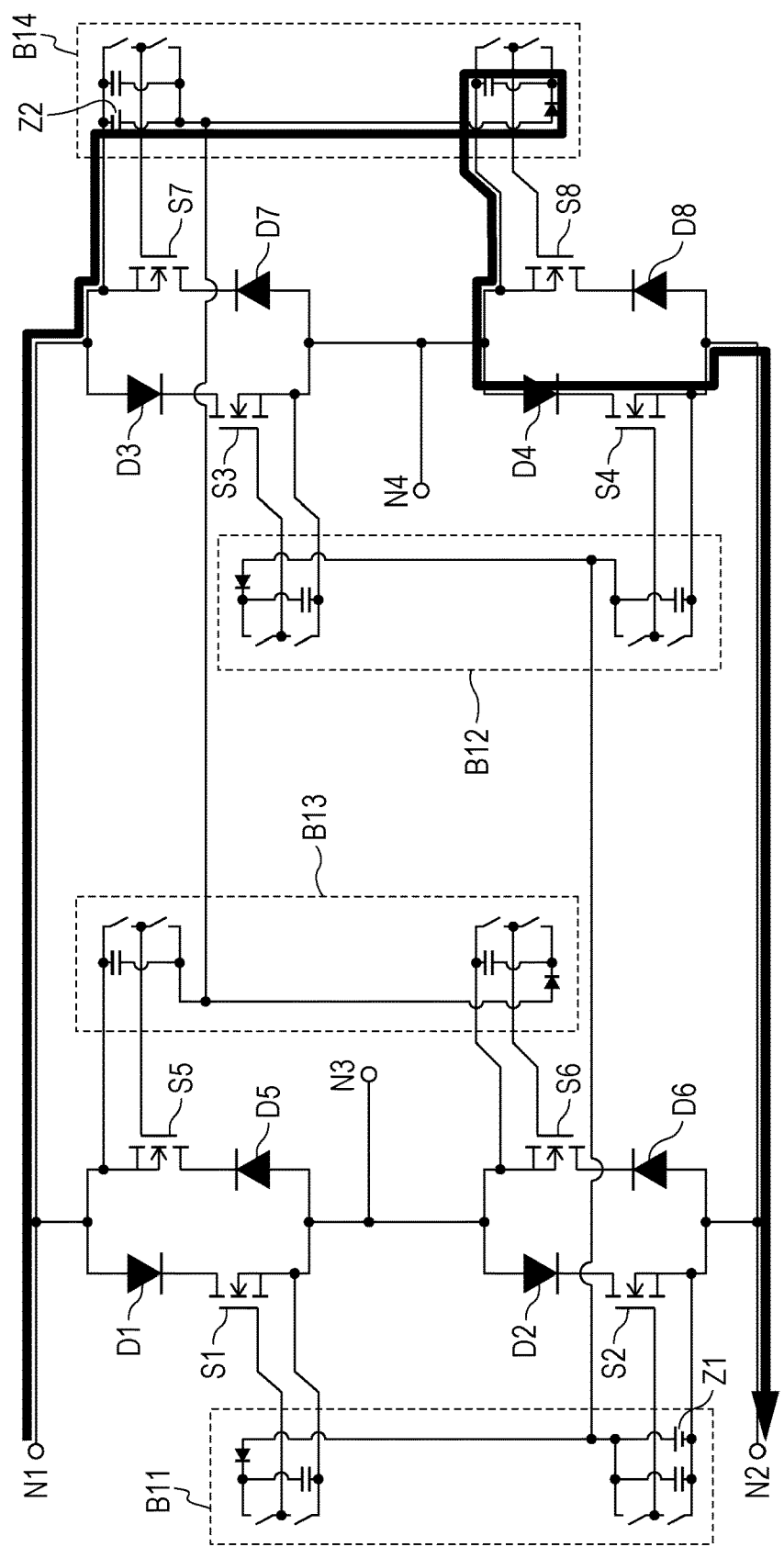
FIG. 13 illustrates actual operation of the inverter circuit according to the second comparative example.

FIG. 12 illustrates ideal operation of the inverter circuit illustrated in FIG. 11. FIG. 13 illustrates actual operation of the inverter circuit illustrated in FIG. 11. Assume that alternating-current electric power is input from the port terminals N1 and N2 of the inverter circuit illustrated in FIG. 11 and that a positive voltage based on an electric potential of the port terminal N2 is applied to the port terminal N1. When the first switch S1 and the fourth switch S4 are on, it is originally intended to pass an electric current through a path indicated by the arrow in FIG. 12. However, the electric current also flows through a path indicated by the arrow in FIG. 13, and an input voltage is applied to a high-side capacitor of the bootstrap circuit B14. As a result, switches used in the bootstrap circuit B14, which generally have low voltage resistance, break down.

Figure 14:
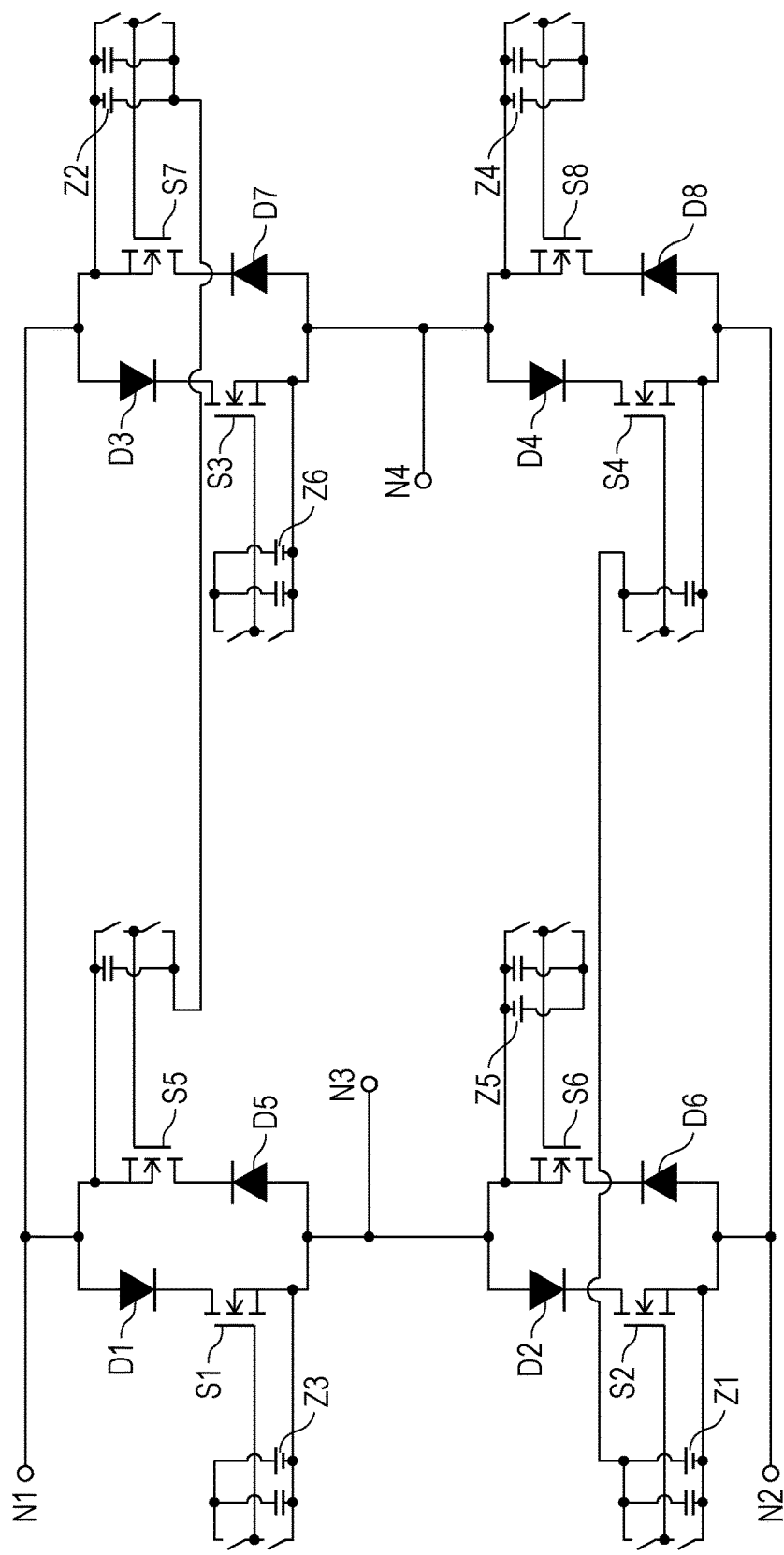
FIG. 14 is a circuit diagram illustrating a configuration of an inverter circuit according to a third comparative example.

FIG. 14 is a circuit diagram illustrating a configuration of an inverter circuit according to a third comparative example that converts and transmits direct-current electric power or alternating-current electric power bi-directionally between port terminals N1 and N2 and port terminals N3 and N4. In order to avoid the problem of FIG. 13, the inverter circuit illustrated in FIG. 14 includes six isolated power sources Z1 through Z6. Use of the six isolated power sources Z1 through Z6 as illustrated in FIG. 14 makes it possible to drive eight switches S1 through S8 as originally intended. However, the number of isolated power sources is large, and the size and cost of the electric power conversion circuit increase accordingly.

In view of this, there are needs for an electric power conversion circuit that is lower in cost and smaller in size than the circuits of the comparative examples.

The inventors accomplished a circuit configuration of the present disclosure in view of the above findings.

Embodiments of the present disclosure are described below with reference to the drawings. In the embodiments below, similar constituent elements are given identical reference signs.

In the present disclosure, ordinal numbers such as "first" and "second" are used not to describe a temporal or spatial order but to distinguish similar constituent elements. These ordinal numbers are interchangeable as appropriate.

First Embodiment

Figure 1:
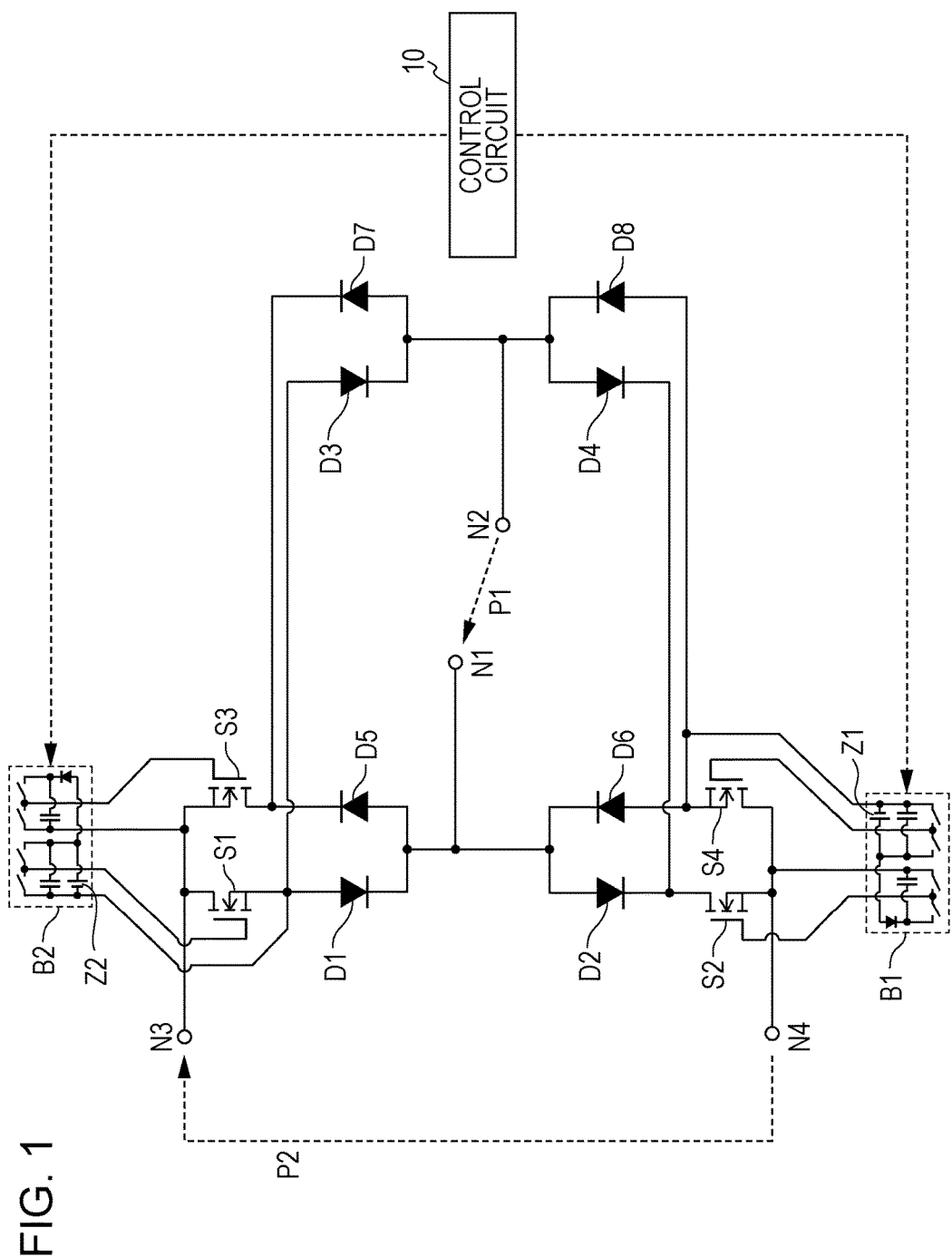
FIG. 1 is a circuit diagram illustrating an example of a configuration of an electric power conversion circuit according to a first embodiment.

FIG. 1 is a circuit diagram illustrating a configuration of an electric power conversion circuit according to a first embodiment. The electric power conversion circuit illustrated in FIG. 1 includes port terminals N1 through N4, diodes D1 through D8, switches S1 through S4, bootstrap circuits B1 and B2, and a control circuit 10.

The port terminals N1 and N2 are examples of "first and second input terminals" of the present disclosure, respectively. The port terminals N3 and N4 are examples of "first and second output terminals" of the present disclosure, respectively. The diodes D1 through D8 are examples of "first through eighth diodes" of the present disclosure, respectively. The switches S1 through S4 are examples of "first through fourth switches" of the present disclosure, respectively. The bootstrap circuits B1 and B2 are examples of "first and second bootstrap circuits" of the present disclosure, respectively.

The electric power conversion circuit illustrated in FIG. 1 converts and transmits direct-current electric power or alternating-current electric power uni-directionally from the port terminals N1 and N2 to the port terminals N3 and N4. The port terminals N1 and N2 constitute a first port P1 for input of electric power, and the port terminals N3 and N4 constitute a second port P2 for output of electric power.

The switches S1 through S4 are N-channel MOSFETs. Each of the switches S1 through S4 has a drain (first terminal), a source (second terminal), and a gate (control terminal).

A cathode of the diode D1 is connected to the port terminal N1, a cathode of the diode D3 is connected to the port terminal N2, and an anode of the diode D1 and an anode of the diode D3 are connected to the port terminal N3 via the switch S1. A source of the switch S1 is connected to the anode of the diode D1 and the anode of the diode D3, and a drain of the switch S1 is connected to the port terminal N3.

An anode of the diode D2 is connected to the port terminal N1, an anode of the diode D4 is connected to the port terminal N2, and a cathode of the diode D2 and a cathode of the diode D4 are connected to the port terminal N4 via the switch S2. A drain of the switch S2 is connected to the cathode of the diode D2 and the cathode of the diode D4, and a source of the switch S2 is connected to the port terminal N4.

An anode of the diode D5 is connected to the port terminal N1, an anode of the diode D7 is connected to the port terminal N2, and a cathode of the diode D5 and a cathode of the diode D7 are connected to the port terminal N3 via the switch S3. A drain of the switch S3 is connected to the cathode of the diode D5 and the cathode of the diode D7, and a source of the switch S3 is connected to the port terminal N3.

A cathode of the diode D6 is connected to the port terminal N1, a cathode of the diode D8 is connected to the port terminal N2, and an anode of the diode D6 and an anode of the diode D8 are connected to the port terminal N4 via the switch S4. A source of the switch S4 is connected to the anode of the diode D6 and the anode of the diode D8, and a drain of the switch S4 is connected to the port terminal N4.

Each of the switches S1 through S4 is connected so that an electric current flows from a drain to a source thereof when the switch is on.

The control circuit 10 generates control signals for turning on or off the switches S1 through S4 and send the control signals to the bootstrap circuits B1 and B2.

Each of the bootstrap circuits B1 and B2 has two pairs of output terminals. The bootstrap circuit B1 includes an isolated power source Z1 and applies predetermined voltages based on electric potentials of the sources of the switches S2 and S4 to gates of the respective switches in accordance with the control signals. The bootstrap circuit B2 includes an isolated power source Z2 and applies predetermined voltages based on electric potentials of the sources of the switches S1 and S3 to gates of the respective switches in accordance with the control signals. The isolated power sources Z1 and Z2 are electrically isolated from sources of power supply to the isolated power sources Z1 and Z2 themselves.

Figure 2A:
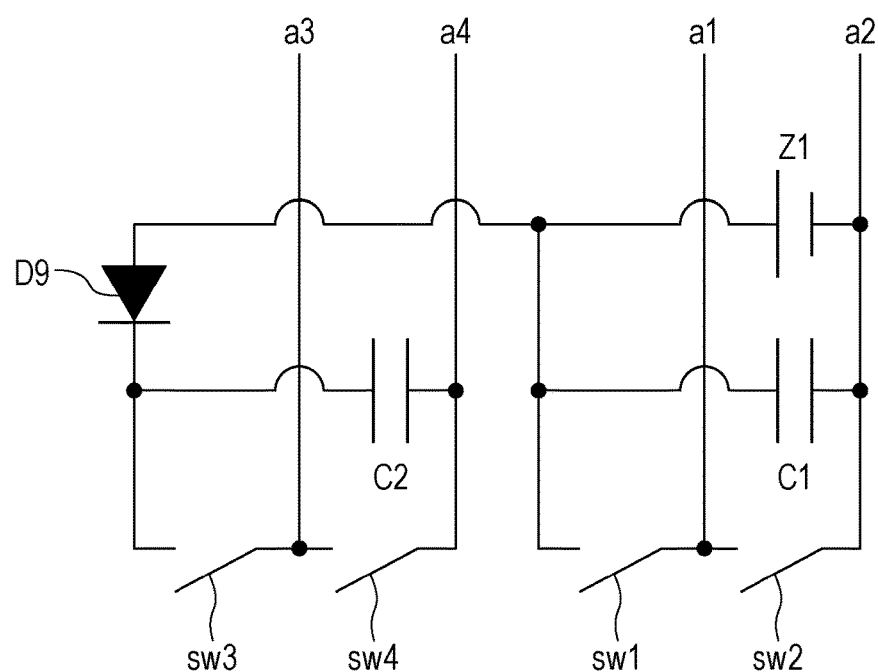
FIG. 2A is a circuit diagram illustrating an example of a configuration of a first bootstrap circuit according to the first embodiment.

FIG. 2A is a circuit diagram illustrating a configuration of the bootstrap circuit B1 illustrated in FIG. 1. The bootstrap circuit B1 includes the isolated power source Z1, capacitors C1 and C2, switches sw1 through sw4, and a diode D9.

The isolated power source Z1 is an example of "first voltage source" of the present disclosure. The capacitor C2 is an example of "first capacitor" of the present disclosure. The diode D9 is an example of "ninth diode" of the present disclosure.

The switches sw1 through sw4 are turned on or off in accordance with control signals supplied from the control circuit 10. A negative electrode of the isolated power source Z1 is connected to one end of the capacitor C1 and is connected to the source of the switch S4. A voltage of the isolated power source Z1 is applied to the capacitor C1 as it is, and the voltage of the isolated power source Z1 is applied to the capacitor C2 via the diode D9. The bootstrap circuit B1 applies the voltage of the isolated power source Z1 or the capacitor C2 based on electric potentials of the sources of the switches S2 and S4 to gates of the respective switches in accordance with the control signals.

Terminals a1 and a2 and terminals a3 and a4 constitute two pairs of output terminals of the bootstrap circuit B1.

The terminal a1 is connected to the gate of the switch S4, and the terminal a2 is connected to the source of the switch S4. When the switch sw1 is turned on, a voltage of the capacitor C1 is applied to the gate of the switch S4. When the switch sw2 is turned on, the gate of the switch S4 is reset.

The terminal a3 is connected to the gate of the switch S2, and the terminal a4 is connected to the source of the switch S2. When the switch sw3 is turned on, a voltage of the capacitor C2 is applied to the gate of the switch S2. When the switch sw4 is turned on, the gate of the switch S2 is reset.

Figure 2B:
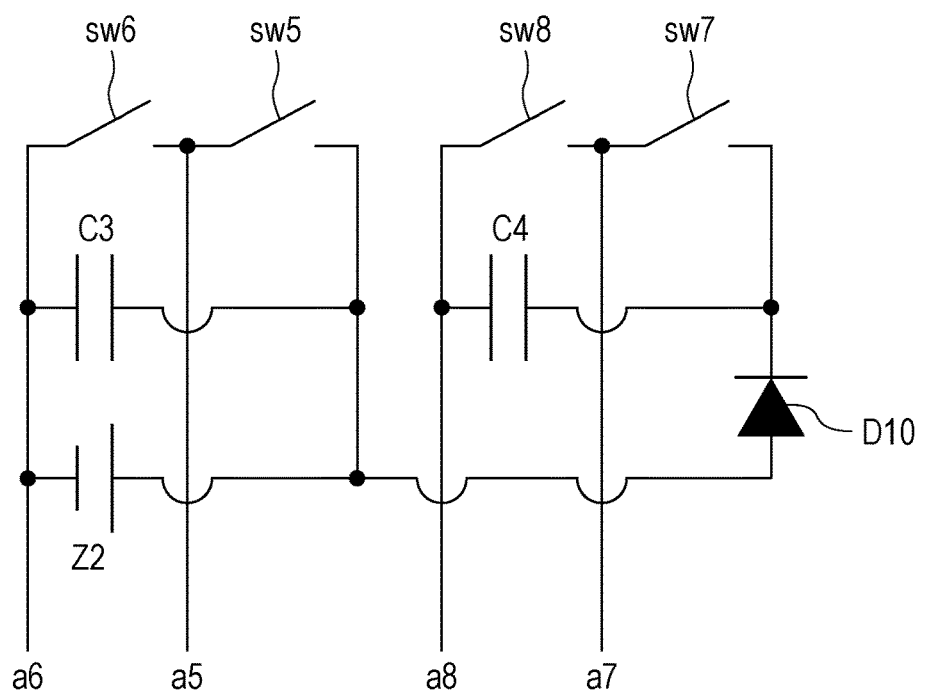
FIG. 2B is a circuit diagram illustrating an example of a configuration of a second bootstrap circuit according to the first embodiment.

FIG. 2B is a circuit diagram illustrating a configuration of the bootstrap circuit B2 illustrated in FIG. 1. The bootstrap circuit B2 includes the isolated power source Z2, capacitors C3 and C4, switches sw5 through sw8, and a diode D10.

The isolated power source Z2 is an example of "second voltage source" of the present disclosure. The capacitor C4 is an example of "second capacitor" of the present disclosure. The diode D10 is an example of "tenth diode" of the present disclosure.

The switches sw5 through sw8 are turned on or off in accordance with control signals supplied from the control circuit 10. A negative electrode of the isolated power source Z2 is connected to one end of the capacitor C3 and is connected to the source of the switch S1. A voltage of the isolated power source Z2 is applied to the capacitor C3 as it is, and the voltage of the isolated power source Z2 is applied to the capacitor C4 via the diode D10. The bootstrap circuit B2 applies the voltage of the isolated power source Z2 or the capacitor C4 based on electric potentials of the sources of the switches S1 and S3 to gates of the respective switches in accordance with the control signals.

Terminals a5 and a6 and terminals a7 and a8 constitute two pairs of output terminals of the bootstrap circuit B2.

The terminal a5 is connected to the gate of the switch S1, and the terminal a6 is connected to the source of the switch S1. When the switch sw5 is turned on, a voltage of the capacitor C3 is applied to the gate of the switch S1. When the switch sw6 is turned on, the gate of the switch S1 is reset.

The terminal a7 is connected to the gate of the switch S3, and the terminal a8 is connected to the source of the switch S3. When the switch sw7 is turned on, a voltage of the capacitor C4 is applied to the gate of the switch S3. When the switch sw8 is turned on, the gate of the switch S3 is reset.

Even in a case where the capacitor C1 is omitted, the bootstrap circuit B1 can operate in a manner similar to a case where the bootstrap circuit B1 includes the capacitor C1. Even in a case where the capacitor C3 is omitted, the bootstrap circuit B2 can operate in a manner similar to a case where the bootstrap circuit B2 includes the capacitor C3.

Next, operation performed when electric power is input to the electric power conversion circuit illustrated in FIG. 1 from the port P1 is described with reference to FIGS. 3 through 6.

Figure 3:
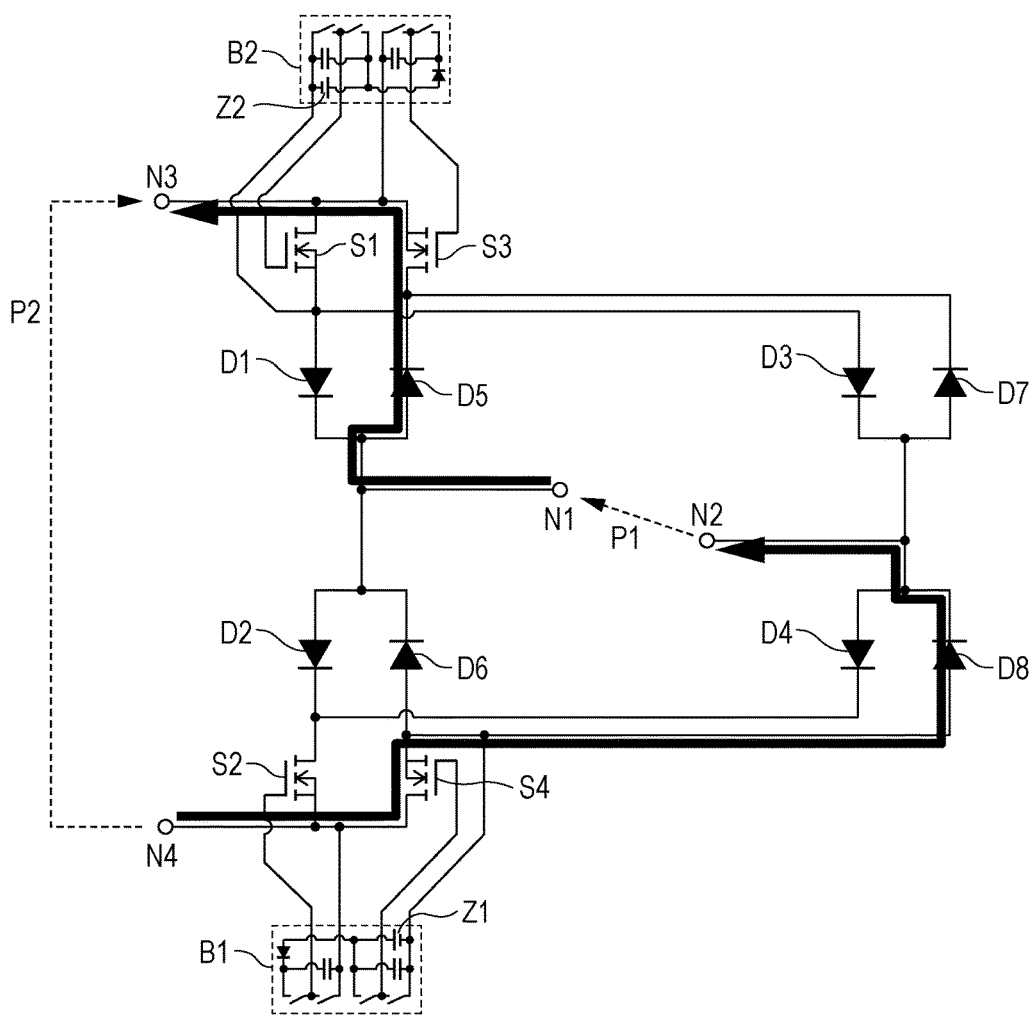
FIG. 3 illustrates an electric current path in a first operation mode in the electric power conversion circuit according to the first embodiment.
Figure 4:
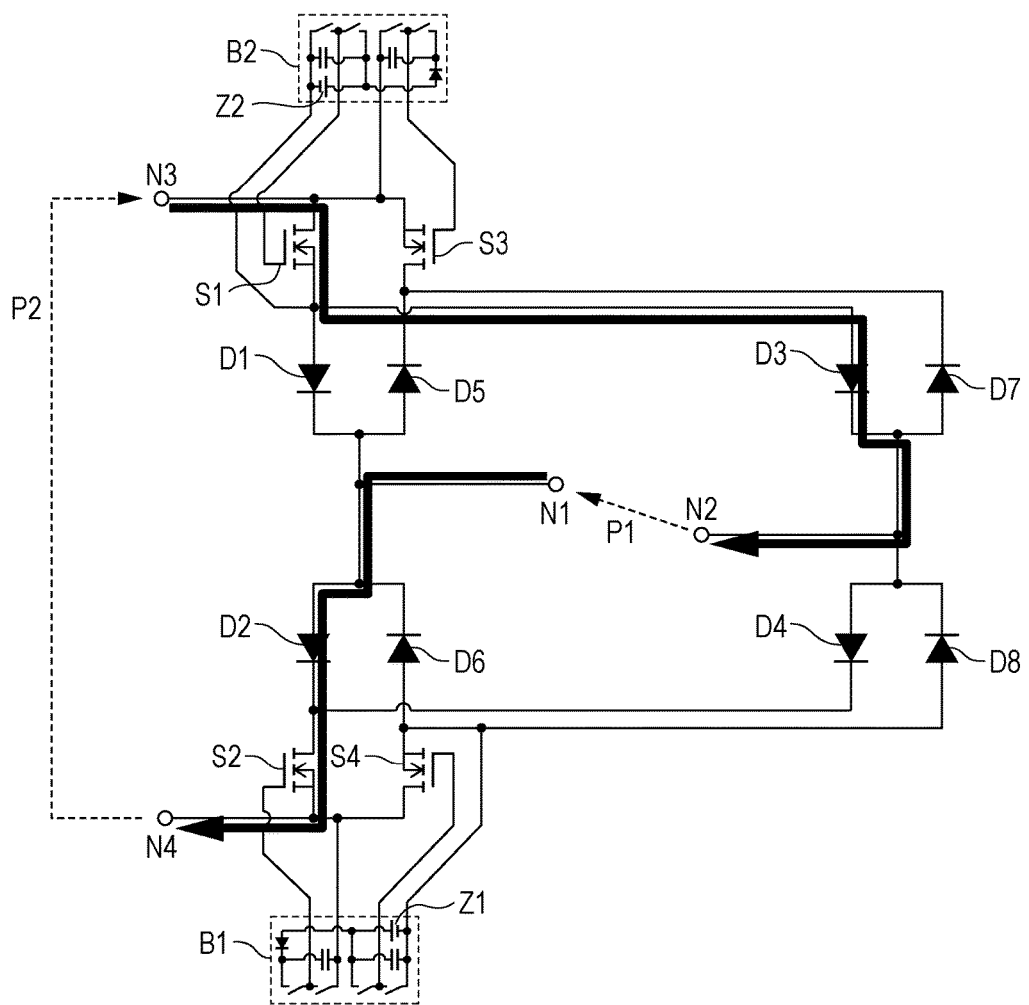
FIG. 4 illustrates an electric current path in a second operation mode in the electric power conversion circuit according to the first embodiment.
Figure 5:
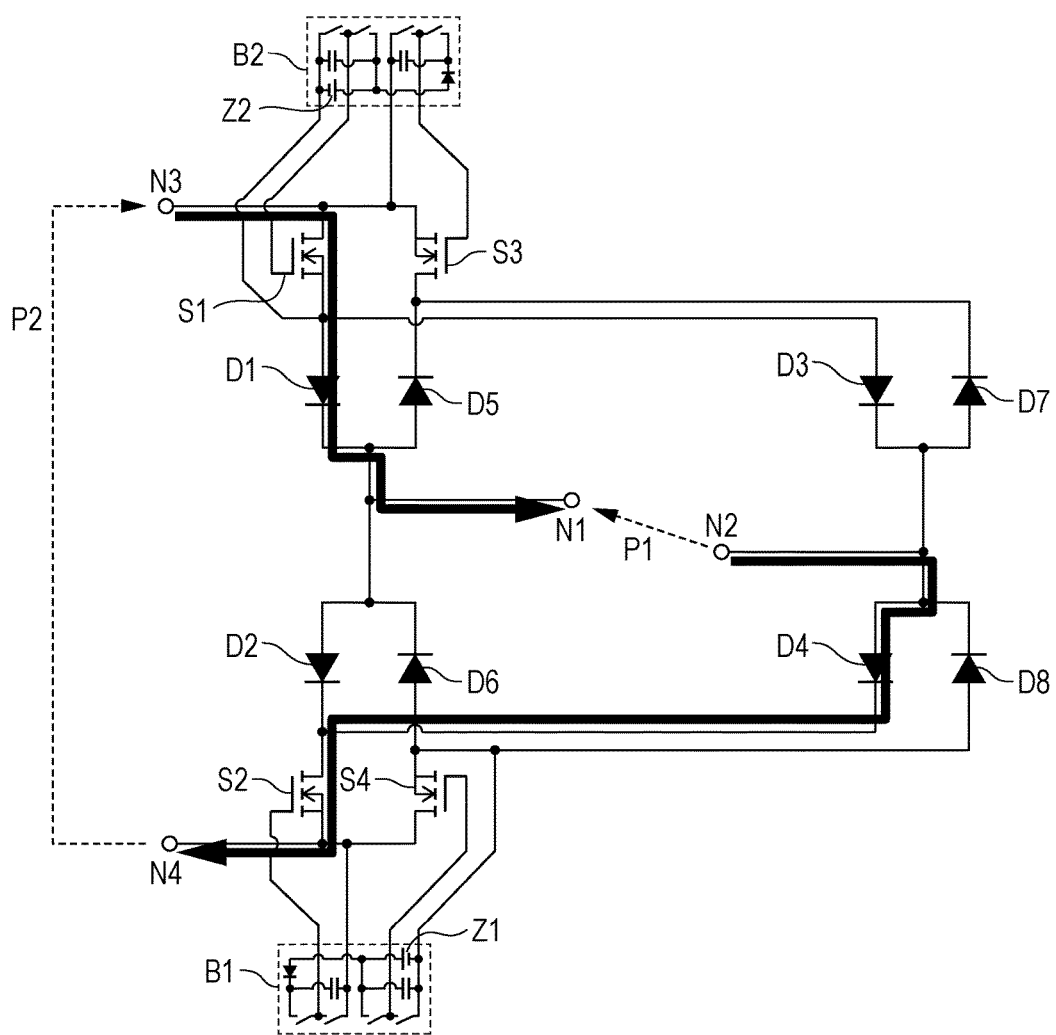
FIG. 5 illustrates an electric current path in a third operation mode in the electric power conversion circuit according to the first embodiment.
Figure 6:
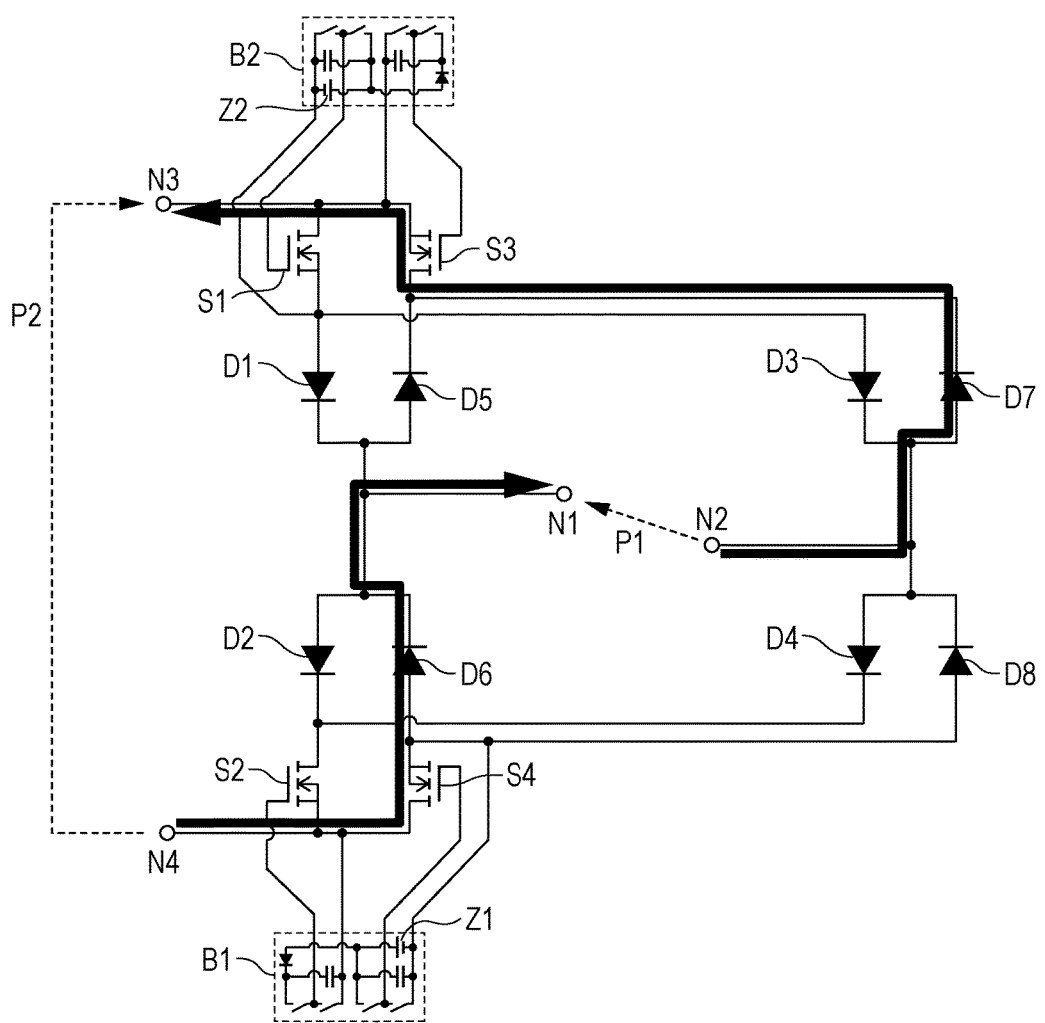
FIG. 6 illustrates an electric current path in a fourth operation mode in the electric power conversion circuit according to the first embodiment.

FIG. 3 illustrates a first operation mode when electric power is input to the electric power conversion circuit illustrated in FIG. 1 from the port P1. FIG. 4 illustrates a second operation mode when electric power is input to the electric power conversion circuit illustrated in FIG. 1 from the port P1. FIG. 5 illustrates a third operation mode when electric power is input to the electric power conversion circuit illustrated in FIG. 1 from the port P1. FIG. 6 illustrates a fourth operation mode when electric power is input to the electric power conversion circuit illustrated in FIG. 1 from the port P1.

The control signals are predetermined code sequences. The electric power conversion circuit performs code modulation or code demodulation of electric power input from the port terminals N1 and N2 in accordance with the code sequences and then outputs the electric power thus subjected to code modulation or code demodulation from the port terminals N3 and N4.

In the first operation mode illustrated in FIG. 3, the third switch S3 and the fourth switch S4 are turned on when a positive electric current is input from the port terminal N1. In the second operation mode illustrated in FIG. 4, the first switch S1 and the second switch S2 are turned on when a positive electric current is input from the port terminal N1. In the third operation mode illustrated in FIG. 5, the first switch S1 and the second switch S2 are turned on when a negative electric current is input from the port terminal N1. In the fourth operation mode illustrated in FIG. 6, the third switch S3 and the fourth switch S4 are turned on when a negative electric current is input from the port terminal N1. When a positive electric current is input from the port terminal N1, the first mode and the second mode are alternated. When a negative electric current is input from the port terminal N1, the third mode and the fourth mode are alternated. As a result, the electric power conversion circuit illustrated in FIG. 1 outputs electric power that has been subjected to code modulation or code demodulation from the port terminals N3 and N4.

In order to drive the plurality of switches S2 and S4 by the bootstrap circuit B1, an operation mode in which the source of the switch S4 that is directly connected to the negative electrode of the isolated power source Z1 and the source of the other switch S2 have equal electric potentials is needed. Furthermore, in order to drive the plurality of switches S1 and S3 by the bootstrap circuit B2, an operation mode in which the source of the switch S1 that is directly connected to the negative terminal of the isolated power source Z2 and the source of the other switch S3 have equal electric potentials is needed.

In the example of FIGS. 1 and 2A, when the switch S4 is on, the source of the switch S2 and the source of the switch S4 have equal electric potentials. In this case, the electric potential of one terminal of the capacitor C2 becomes equal to that of the negative electrode of the isolated power source Z1 via the terminal a4, a source node of the switch S2, the switch S4, a source node of the switch S4, and the terminal a2. The electric potential of the other terminal of the capacitor C2 becomes equal to that of the positive electrode of the isolated power source Z1 via the diode D9. As a result, the voltage of the isolated power source Z1 is applied across the terminals of the capacitor C2, and thus an electric charge is stored from the isolated power source Z1 into the capacitor C2.

The switch sw3 and the switch sw4 are turned on and off in a complementary manner. When the switch sw3 is on, the voltage of the capacitor C2 is applied across the terminals a3 and a4. This turns on the switch S2. When the switch sw4 is on, the terminals a3 and a4 are short-circuited. This turns off the switch S2.

In the example of FIGS. 1 and 2B, when the switch S1 is on, the source of the switch S1 and the source of the switch S3 have equal electric potentials. In this case, the electric potential of one terminal of the capacitor C4 becomes equal to that of the negative electrode of the isolated power source Z2 via the terminal a8, a source node of the switch S3, the switch S1, a source node of the switch S1, and the terminal a6. The electric potential of the other terminal of the capacitor C4 becomes equal to that of the positive electrode of the isolated power source Z2 via the diode D10. As a result, the voltage of the isolated power source Z2 is applied across the terminals of the capacitor C4, and thus an electric charge is stored from the isolated power source Z2 into the capacitor C4.

The switch sw7 and the switch sw8 are turned on and off in a complementary manner. When the switch sw7 is on, the voltage of the capacitor C4 is applied across the terminals a7 and a8. This turns on the switch S3. When the switch sw8 is on, the terminals a7 and a8 are short-circuited. This turns off the switch S3.

The source of the switch S2 and the drain of the switch S4 are connected to each other. When the switch S4 is on, the source of the switch S2 has an electric potential equal to the source of the switch S4. Accordingly, the switches S2 and S4 can be driven by the bootstrap circuit B1 having two pairs of output terminals.

The drain of the switch S1 and the source of the switch S3 are connected to each other. When the switch S1 is on, the source of the switch S3 has an electric potential equal to the source of the switch S1. Accordingly, the switches S1 and S3 can be driven by the bootstrap circuit B2 having two pairs of output terminals.

According to the above configuration, the four switches S1 through S4 can be driven by the two isolated power sources Z1 and Z2. Since the number of isolated power sources is smaller than that in the comparative example of FIG. 14, it is possible to achieve a reduction in size and cost of the circuit.

According to the above configuration, the electric power conversion circuit is constituted by four semiconductor switches and eight diodes as compared with the electric power conversion circuits according to the conventional examples in FIGS. 11 and 14 each of which is constituted by eight semiconductor switches and eight diodes. It is therefore possible to achieve a reduction in size and cost of the circuit.

The source of the first switch S1 that is directly connected to the negative electrode of the isolated power source Z2 is not directly connected to the first input terminal N1 or the second input terminal N2 but connected to the first input terminal N1 via the first diode D1 and to the second input terminal N2 via the third diode D3. This makes it possible to prevent the bootstrap circuit B2 from breaking down due to application of an input voltage when a positive voltage is applied across the first input terminal N1 and the second input terminal N2. Similarly, the source of the fourth switch S4 that is directly connected to the negative electrode of the isolated power source Z1 is not directly connected to the first input terminal N1 or the second input terminal N2 but connected to the first input terminal N1 via the sixth diode D6 and to the second input terminal N2 via the eighth diode D8. This makes it possible to prevent the bootstrap circuit B1 from breaking down due to application of an input voltage when a negative voltage is applied across the first input terminal N1 and the second input terminal N2.

For example, an operation mode in which all of the switches are on or off may be added to the operation modes of the electric power conversion circuit described above. For example, when a current-type generator is connected to the electric power conversion circuit, an operation mode in which all of the switches are on makes it possible to prevent the generator from being opened, thereby suppressing a rapid rise in voltage. When a voltage-type generator is connected to the electric power conversion circuit, an operation mode in which all of the switches are off makes it possible to prevent the generator from being short-circuited, thereby suppressing a rapid increase in electric current.

The switches S1 through S4 may be bipolar transistors such as IGBTs instead of N-channel MOSFETs. In this case, "drain" or "first terminal" of a switch in the description of this specification is replaced with "collector", and "source" or "second terminal" of a switch in the description of this specification is replaced with "emitter".

Figure 7:
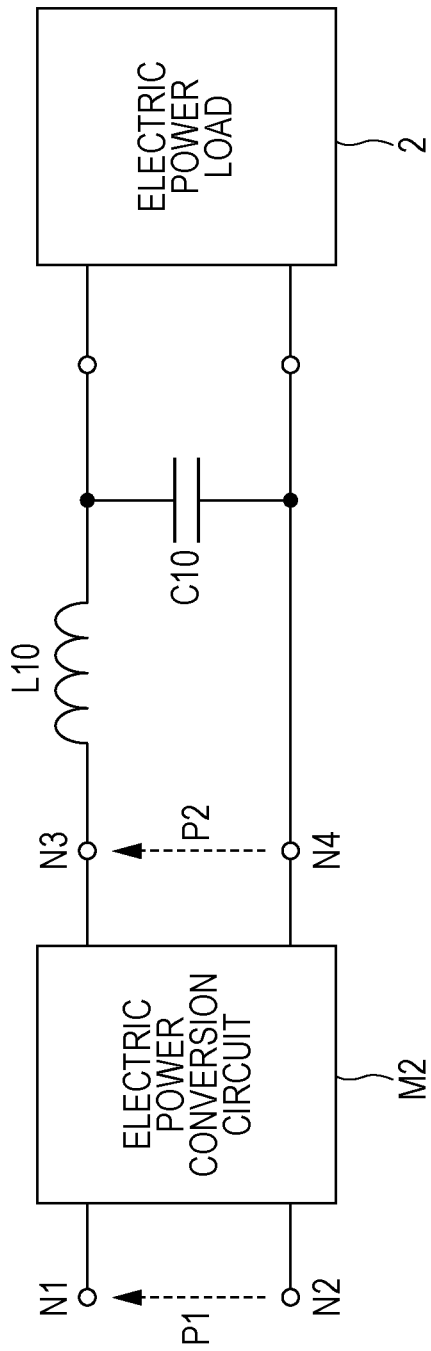
FIG. 7 illustrates an example of connection between the electric power conversion circuit according to the first embodiment and an electric power load.

FIG. 7 illustrates a connection example of the electric power conversion circuit illustrated in FIG. 1. An electric power conversion circuit M2 illustrated in FIG. 7 is the electric power conversion circuit illustrated in FIG. 1. The electric power conversion circuit described above may be used in combination with a reactor and a capacitor. For example, when electric power conversion circuit is connected to an electric power load 2 from the second port P2 via a reactor L10 and a capacitor C10 as illustrated in FIG. 7, it is possible to smooth an output electric current and an output voltage.

According to the electric power conversion circuit according to the first embodiment, it is possible to achieve unidirectional electric power conversion of direct-current electric power or alternating-current electric power by an electric power conversion circuit that is lower in cost and smaller in size than the conventional arts.

Second Embodiment

Figure 8:
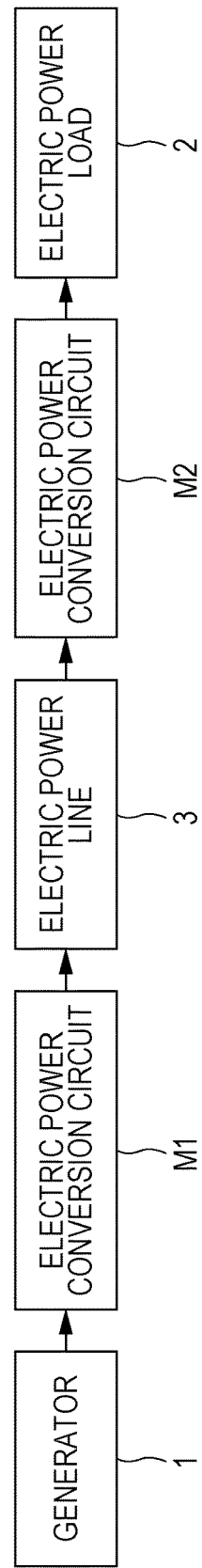
FIG. 8 is a block diagram illustrating an outline configuration of an electric power transmission system according to a second embodiment.

FIG. 8 is a block diagram illustrating an outline configuration of an electric power transmission system according to a second embodiment. The electric power transmission system illustrated in FIG. 8 includes at least one generator 1, which is a power source, at least one electric power load 2, which is a load, an electric power line 3, and electric power conversion circuits M1 and M2 according to the first embodiment. The electric power line 3 includes, for example, a wire for transmitting electric power. The electric power conversion circuit M1 is provided between a designated one of the at least one generator 1 and the electric power line 3 and is used as at least one electric power transmitting device. The electric power conversion circuit M2 is provided between the electric power line 3 and a designated one of the at least one load and is used as at least one electric power receiving device.

An identical code sequence is given to the electric power conversion circuit M1 used as an electric power transmitting device and the electric power conversion circuit M2 used as an electric power receiving device. The electric power conversion circuit M1 performs code modulation of electric power input from the generator 1 in accordance with the code sequence and then outputs the electric power to the electric power line 3. The electric power conversion circuit M2 performs code demodulation of the electric power input from the electric power line 3 in accordance with the code sequence and then outputs the electric power to the electric power load 2. In this way, it is possible to transmit electric power from the specific generator 1 to the specific electric power load 2. It is therefore possible to reduce the number of isolated power sources used in the electric power transmission system, thereby making it possible to introduce the electric power transmission system at low cost.

In the above embodiment, an example in which the electric power conversion circuit performs code modulation or code demodulation of electric power in accordance with a code sequence has been described. However, operation of the electric power conversion circuit is not limited to this. For example, the electric power conversion circuit may perform pulse width modulation of electric power in accordance with a PWM signal.

Overview of Embodiments

An electric power conversion circuit according to a first aspect includes first and second input terminals, first and second output terminals, first through eighth diodes, and first through fourth switches each of which has a first terminal, a second terminal, and a control terminal and is turned on or off in accordance with a control signal, a cathode of the first diode being connected to the first input terminal, a cathode of the third diode being connected to the second input terminal, an anode of the first diode and an anode of the third diode being connected to the first output terminal via the first switch, an anode of the second diode being connected to the first input terminal, an anode of the fourth diode being connected to the second input terminal, a cathode of the second diode and a cathode of the fourth diode being connected to the second output terminal via the second switch, an anode of the fifth diode being connected to the first input terminal, an anode of the seventh diode being connected to the second input terminal, a cathode of the fifth diode and a cathode of the seventh diode being connected to the first output terminal via the third switch, a cathode of the sixth diode being connected to the first input terminal, a cathode of the eighth diode being connected to the second input terminal, an anode of the sixth diode and an anode of the eighth diode being connected to the second output terminal via the fourth switch, each of the first through fourth switches being connected so that an electric current flows from the first terminal to the second terminal thereof in a case where the switch is on, and the electric power conversion circuit further including a first voltage source, a first bootstrap circuit that applies a predetermined voltage to the control terminal of each of the second and fourth switches in accordance with the control signal, a second voltage source, and a second bootstrap circuit that applies a predetermined voltage to the control terminal of each of the first and third switches in accordance with the control signal.

In the electric power conversion circuit according to the first aspect, an electric power conversion circuit according to a second aspect is configured such that the second terminal of the fourth switch is connected to a negative electrode of the first voltage source, the first bootstrap circuit includes at least one first capacitor to which a voltage of the first voltage source is applied via at least one ninth diode, the first bootstrap circuit applies a voltage of the first voltage source or the first capacitor based on an electric potential of the second terminal of each of the second and fourth switches to the control terminal of the switch in accordance with the control signal, the second terminal of the first switch is connected to a negative electrode of the second voltage source, the second bootstrap circuit includes at least one second capacitor to which a voltage of the second voltage source is applied via at least one tenth diode, and the second bootstrap circuit applies a voltage of the second voltage source or the second capacitor based on an electric potential of the second terminal of each of the first and third switches to the control terminal of the switch in accordance with the control signal.

In the electric power conversion circuit according to the first or second aspect, an electric power conversion circuit according to a third aspect is configured such that the first through fourth switches are N-channel MOSFETs, the first terminal is a drain, and the second terminal is a source.

In the electric power conversion circuit according to the first or second aspect, an electric power conversion circuit according to a fourth aspect is configured such that the first through fourth switches are bipolar transistors, the first terminal is a collector, and the second terminal is an emitter.

In the electric power conversion circuit according to one of the first through fourth aspects, an electric power conversion circuit according to a fifth aspect is configured such that each of the first and second voltage sources is an isolated power source.

In the electric power conversion circuit according to one of the first through fifth aspects, an electric power conversion circuit according to a sixth aspect is configured such that the control signal is a predetermined code sequence, and code modulation or code demodulation of electric power input from the first and second input terminals is performed in accordance with the code sequence, and then the electric power thus subjected to code modulation or code demodulation is output from the first and second output terminals.

In the electric power conversion circuit according to the sixth aspect, an electric power conversion circuit according to a seventh aspect is configured such that a state where the first and second switches are on and a state where the third and fourth switches are on are alternated.

An electric power transmission system according to an eighth aspect includes at least one power source, at least one load, and an electric power line, the electric power transmission system further including a first electric power conversion circuit that is the electric power conversion circuit according to the sixth or seventh aspect that is provided between a designated one of the at least one power source and the electric power line and a second electric power conversion circuit that is the electric power conversion circuit according to the sixth or seventh aspect that is provided between the electric power line and a designated one of the at least one load, the first electric power conversion circuit performing code modulation of electric power input from the power source in accordance with the code sequence and then outputting the electric power to the electric power line, and the second electric power conversion circuit performing code demodulation of the electric power input from the electric power line in accordance with the code sequence and then outputting the electric power to the load, and thereby the electric power is transmitted from the designated power source to the designated load.

An electric power conversion circuit according to the present disclosure is useful for conversion of electric power in an alternating-current power source system or in a power source system using both direct-current and alternating-current. Furthermore, an electric power transmission system according to the present disclosure is useful for transmission of electric power from a generator such as a solar power generator, a wind power generator, or a hydropower generator to a railroad, an electric vehicle, or the like.

What is claimed is:

1. Electric power conversion circuitry comprising:
   a first input terminal;
   a second input terminal;
   a first output terminal;
   a second output terminal;
   a first diode that includes a first anode and a first cathode, the first cathode being connected to the first input terminal;
   a second diode that includes a second anode and a second cathode, the second anode being connected to the first input terminal;
   a third diode that includes a third anode and a third cathode, the third cathode being connected to the second input terminal;
   a fourth diode that includes a fourth anode and a fourth cathode, the fourth anode being connected to the second input terminal;
   a fifth diode that includes a fifth anode and a fifth cathode, the fifth anode being connected to the first input terminal;
   a sixth diode that includes a sixth anode and a sixth cathode, the sixth cathode being connected to the first input terminal;
   a seventh diode that includes a seventh anode and a seventh cathode, the seventh anode being connected to the second input terminal;
   an eighth diode that includes an eighth anode and an eighth cathode, the eighth cathode being connected to the second input terminal;
   a first switch that includes a first control terminal and is connected between the first output terminal and the first anode;
   a second switch that includes a second control terminal and is connected between the second cathode and the second output terminal;
   a third switch that includes a third control terminal and is connected between the first output terminal and the fifth cathode;
   a fourth switch that includes a fourth control terminal and is connected between the sixth anode and the second output terminal;
   first bootstrap circuitry that includes a first voltage source and is connected to the second and fourth control terminals; and
   second bootstrap circuitry that includes a second voltage source and is connected to the first and third control terminals.

2. The electric power conversion circuitry according to claim 1, wherein the first bootstrap circuitry turns on or off the second and fourth switches by applying second and fourth control voltages to the second and fourth control terminals, respectively; and the second bootstrap circuitry turns on or off the first and third switches by applying first and third control voltages to the first and third control terminals, respectively.

3. The electric power conversion circuitry according to claim 2, wherein the first through fourth control voltages change in accordance with first through fourth code sequences, respectively; and the first through fourth switches, based on the first through fourth code sequences, code-modulate or code-demodulate power input from the first and second input terminals to output the code-modulated or code demodulated power to the first and second output terminals.

4. The electric power conversion circuitry according to claim 3, wherein the first and second bootstrap circuitry switches between a first state where the first and second switches are on and the third and fourth switches are off and a second state where the first and second switches are off and the third and fourth switches are on.

5. An electric power transmission system comprising:
a power source;
first electric power conversion circuitry;
an electric power transmission path;
second electric power conversion circuitry; and
a load,
wherein each of the first and second electric power conversion circuitry is the electric power conversion circuitry according to claim 3,
the first electric power conversion circuitry code-modulates power input from the power source to outputs the code-modulated power to the electric power transmission path, and
the second electric power conversion circuitry code-demodulates the code-modulated power to output the code-demodulated power to the load.

6. The electric power conversion circuitry according to claim 1, wherein the fourth switch further includes a terminal that is connected to the sixth anode and a negative electrode of the first voltage source; and the first bootstrap circuitry includes:
a first capacitor; and
a ninth diode that is disposed on a first path extending from a positive electrode of the first voltage source to the negative electrode of the first voltage source via the first capacitor.

7. The electric power conversion circuitry according to claim 6, wherein the first path passes through the fourth switch; and the first voltage source applies a first power source voltage to the first capacitor through the first path when the fourth switch is on.

8. The electric power conversion circuitry according to claim 7, wherein each of the second and fourth control voltages is generated from at least one selected from the first power source voltage of the first voltage source and a first charge voltage charged in the first capacitor.

9. The electric power conversion circuitry according to claim 6, wherein the first switch further includes a terminal that is connected to the first anode and a negative electrode of the second voltage source; and the second bootstrap circuitry includes:
a second capacitor; and
a tenth diode that is disposed on a second path extending from a positive electrode of the second voltage source to the negative electrode of the second voltage source via the second capacitor.

10. The electric power conversion circuitry according to claim 9, wherein the second path passes through the first switch; and the second voltage source applies a second power source voltage to the second capacitor through the second path when the first switch is on.

11. The electric power conversion circuitry according to claim 10, wherein each of the first and third control voltages is generated from the second power source voltage of the second voltage source and a second charge voltage charged in the second capacitor.

12. The electric power conversion circuitry according to claim 1, wherein each of the first through fourth switches is an N-channel MOSFET or a bipolar transistor.

13. The electric power conversion circuitry according to claim 1, wherein each of the first and second voltage sources is an isolated power source.

* * * * *